United States Patent
Stocker et al.

(10) Patent No.: US 7,898,152 B2
(45) Date of Patent: Mar. 1, 2011

(54) BRACING ELEMENT FOR BRACING A PIEZOELECTRIC ACTUATOR AND PIEZOELECTRIC ACTUATOR WITH THE BRACING ELEMENT

(75) Inventors: Werner Stocker, St. Peter Freien (AT); Andreas Jakope, Ehrenhausen (AT); Franz Veronik, Stainz (AT); Manfred Reinisch, Gr. St. Florian (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 12/403,484

(22) Filed: Mar. 13, 2009

(65) Prior Publication Data
US 2009/0256448 A1 Oct. 15, 2009

Related U.S. Application Data

(63) Continuation of application No. PCT/DE2007/001589, filed on Sep. 6, 2007.

(30) Foreign Application Priority Data

Sep. 13, 2006 (DE) .......................... 10 2006 043 027

(51) Int. Cl.
*H01L 41/04* (2006.01)
*H01L 41/08* (2006.01)
(52) U.S. Cl. ...................................................... 310/328
(58) Field of Classification Search ................... 310/328
See application file for complete search history.

(56) References Cited

U.S. PATENT DOCUMENTS

| 5,113,108 A | 5/1992 | Yamashita et al. |
| 5,208,506 A * | 5/1993 | Yamashita ..................... 310/328 |
| 5,250,868 A * | 10/1993 | Shirasu ......................... 310/328 |
| 5,272,797 A | 12/1993 | Miyoshi |
| 5,805,529 A * | 9/1998 | Purcell .......................... 367/163 |
| 6,172,445 B1 | 1/2001 | Heinz et al. |
| 6,279,871 B1 * | 8/2001 | Ogura et al. ............. 251/129.06 |
| 6,333,586 B1 * | 12/2001 | Polach et al. .................. 310/328 |
| 6,333,587 B1 * | 12/2001 | Heinz et al. ................... 310/328 |
| 6,435,430 B1 | 8/2002 | Ruehle et al. |
| 6,465,936 B1 * | 10/2002 | Knowles et al. ............... 310/328 |
| 6,563,687 B2 * | 5/2003 | Kawazoe et al. .......... 361/301.4 |
| 6,617,766 B1 | 9/2003 | Stoecklein et al. |
| 6,700,308 B2 * | 3/2004 | Heinz ............................ 310/328 |
| 7,429,815 B2 * | 9/2008 | Gibson et al. ................. 310/344 |
| 2003/0034594 A1 | 2/2003 | Schmieder et al. |

(Continued)

FOREIGN PATENT DOCUMENTS

DE 196 50 900 A1 6/1998

(Continued)

OTHER PUBLICATIONS

Kurt Lange, editor, "Umformtechnik: Handbuch für Industrie and Wissenschaft; Band 3: Blechbearbeitung," 2nd, completely revised and extended edition, pp. 578-585, 1990, (p. 580, lines 19-21 as mentioned in European examination report dated Dec. 21, 2010 provided in English).

*Primary Examiner* — J. SanMartin
(74) *Attorney, Agent, or Firm* — Slater & Matsil, L.L.P.

(57) ABSTRACT

A bracing element for bracing a piezoelectric multiple layer component includes a tubular body that is at least partially corrugated. A piezoelectric actuator with the bracing element is also disclosed.

18 Claims, 2 Drawing Sheets

U.S. PATENT DOCUMENTS

2003/0107301 A1 * 6/2003 Asano et al. .................. 310/328
2007/0252474 A1 11/2007 D'Arrigo

FOREIGN PATENT DOCUMENTS

| | | | |
|---|---|---|---|
| DE | 196 53 555 | A1 | 6/1998 |
| DE | 197 44 235 | A1 | 4/1999 |
| DE | 199 08 471 | A1 | 9/2000 |
| DE | 199 12 666 | A1 | 9/2000 |
| DE | 199 28 185 | A1 | 1/2001 |
| DE | 199 28 185 | B4 | 5/2006 |
| WO | WO 2005/062395 | A1 | 7/2005 |

* cited by examiner

BRACING ELEMENT FOR BRACING A PIEZOELECTRIC ACTUATOR AND PIEZOELECTRIC ACTUATOR WITH THE BRACING ELEMENT

This application is a continuation of co-pending International Application No. PCT/DE2007/001589, filed Sep. 6, 2007, which designated the United States and was not published in English, and which claims priority to German Application No. 10 2006 043 027.1 filed Sep. 13, 2006, both of which applications are incorporated herein by reference.

TECHNICAL FIELD

A bracing element will be described, as well as a piezoelectric actuator with the bracing element. Also, a bracing element for bracing a piezoelectric multiple-layer component will be specified.

BACKGROUND

From German patent publication DE 199 28 185 B4 and U.S. Pat. No. 6,617,766 B1, a piezoelectric element is known that is pressed onto a mounting or support plate by means of a bias spring and a helical spring plate arranged above the bias spring.

From WO 2005/062395 and US counterpart 2007/0252474 A1, a piezoelectric actuator is known with a tubular spring element provided with recesses.

From US 2003/034594 A1, a piezoelectric actuator is similarly known with a tubular spring element provided with recesses.

SUMMARY

In one aspect, means can optimize the stable operation of the piezoelectric actuator. In another aspect, a piezoelectric actuator can exhibit stable operation.

A bracing element for bracing a piezoelectric multiple-layer component will be specified, wherein the bracing element includes a tubular body. The tubular body is preferably at least partially corrugated or has a wave-shaped region. This means that it has rippling or a wave-shaped structure in at least one region. The tubular body is advantageously produced without seams.

Another region or section of the tubular body could have a non-corrugated construction, for example, a smooth hollow cylinder.

All of the regions or sections of the tubular body can have recesses or openings that increase the elasticity or expandability or compressibility of the body. Here, the recesses advantageously have rounded shapes without sharp edges, wherein this arrangement puts less stress on the structural integrity of the tubular body under mechanical loading.

According to a preferred embodiment, the tubular body is a corrugated tube.

The wave-shaped region of the body can have straight sections. For example, the wave-shaped region could be formed by corrugations with angled recesses and bulges. The region could also have curved sections or natural curves, such as, e.g., natural recesses and bulges or curves transitioning continuously one into the other. A combination of straight and curved sections could also be provided.

A low region of a corrugation of the wave-shaped region is here turned toward the inner space of the tubular body or formed by an indented region. In contrast, a high region of a shaft is turned away from the tubular body or formed by a bulged region of the tubular body.

The bracing element can include a tubular body that has different cross-axial inner diameters. The inner diameter of the tubular body that leads, in the cross-axial projection, to a low region of a corrugation of the waveform of the tubular body is here advantageously less than the inner diameter that leads, in the cross-axial projection, to a high region of the corrugation.

Where the inner diameter of the tubular body has a local minimum value, the tubular body could be viewed as indented. An indented region of the tubular body could be formed according to one embodiment as a peripheral groove or impression.

Where the inner diameter of the tubular body has a local maximum value, the tubular body could be viewed as bulged. A bulged region of the tubular body could be formed according to one embodiment as a peripheral bead.

According to a preferred embodiment, the tubular body has a thickness that is constant or at least as constant as possible. This applies both to indented and bulged regions.

According to another embodiment, the tubular body has, in turn, different thicknesses. In this case, a region with a minimum local thickness corresponds to a low region of a corrugation and a region with a maximum local thickness corresponds to a high region of a corrugation. Low regions of a corrugation could be viewed here as regions of the tubular body that have had material removed.

According to one embodiment of the bracing element, the tubular body has a constant inner diameter, i.e., the inner wall of the tubular body is a planar, smooth surface. In contrast, the outer surface of the tubular body has a rippled or a wave-shaped structure that is formed by indentations and bulges, advantageously in a regular pattern.

The outer contours of the tubular body could be circular or constructed in the form of a regular polygon. The outer contours are those that become visible for a viewer when the longitudinal axis of the tubular body lies in the line of sight of the viewer.

It has been shown that a tubular body with at least a partially corrugated shape has the advantage of having greater elasticity compared to a non-corrugated tubular body for bracing a piezoelectric multiple-layer component. Thus, the tubular body can withstand mechanical loads over a longer period of time. Also, the arrangement of the low and the high regions of the waveform or the wavelength of a wave can influence the stiffness or elasticity, so that the shape of the waveform advantageously allows an exact setting of the desired mechanical properties of the tubular body.

The mechanical properties of the tubular body could also be influenced or set by its varying thickness, provided according to an embodiment, alone or together with the arrangement of the corrugations. Regions of the tubular body with smaller thickness tend to bend inwardly under mechanical compressive stress compared with thicker regions. Under mechanical tensile strain, they can expand. In contrast, stronger or thicker regions of the tubular body are more resistant to mechanical loading or can buckle or flatten less and impart to the tubular body a correspondingly higher stiffness. A sufficiently high stiffness plays a role in the bracing of a piezoelectric multiple-layer component.

The tubular body advantageously contains a permanently elastic material. Here, the material advantageously exhibits a high stiffness. According to one embodiment, the tubular body contains steel.

In addition, a piezoelectric actuator with a bracing element of the described type will be specified. The piezoelectric actuator has a piezoelectric multiple-layer component that is contained in the tubular body. The tubular body sets the multiple-layer component under axial compressive stress.

The piezoelectric multiple-layer component has ceramic layers that can be activated piezoelectrically and also electrode layers for generating electric fields in the ceramic layers. Here, the electrode layers could contact supply lines of the piezoelectric actuator, for example, in the form of inner or outer wires or an external contact or contact layer arranged on the outside of the surface of the multiple-layer component. The ceramic layers advantageously contain a PZT ceramic.

The ceramic layers and electrode layers of the piezoelectric multiple-layer components advantageously form a monolithic body. This could be achieved, for example, by means of sintering.

According to one embodiment, the piezoelectric multiple-layer component is mechanically connected on each end to a counter layer. Here, the tubular body could be mechanically connected on the ends to the counter layers. It is preferred that the height of the tubular body correspond to that of the multiple-layer component or is slightly shorter.

BRIEF DESCRIPTION OF THE DRAWINGS

The described subject matter will be explained in greater detail with reference to the following embodiments and figures.

Figure 1A:
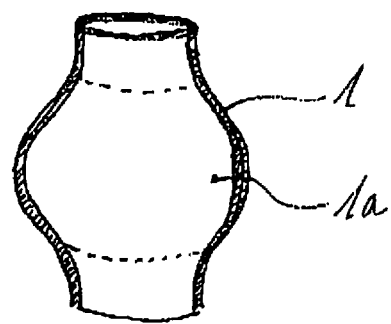
FIG. 1a, shows a tubular body with a peripheral bulge.

The following list of reference symbols can be used in conjunction with the drawings:
P Piezoelectric actuator
1 Corrugated tube
1a Bulged region of the corrugated tube
1b Indented region of the corrugated tube
2 Piezoelectric multiple-layer component
2a Ceramic layers
2b Electrode layers
3 Counter layer

DETAILED DESCRIPTION

FIG. 1a shows a tube 1 with a diameter that is enlarged in the region 1a and that could be understood as a peripheral bulge or bead. The tube has a simple waveform that begins, according to the view, on the upper or lower end of the tube with a smaller tube diameter than the bulge 1a. The wall thickness of the tube is advantageously constant or advantageously as constant as possible. The peripheral bulge is advantageously generated by means of an internal pressure shaping method. The method includes a process in which the inner wall of the tube is bulged outward by means of mechanical pressure, for example, using a suitable object. The bulge advantageously completely surrounds the tube. At the peak region of the shown wave, i.e., in the region where the tube has its greatest diameter, under mechanical compressive stress the tube tends to bend inwardly or yield slightly more than at other regions of the tube. Under tensile strain, the same region tends to flatten.

Figure 1B:
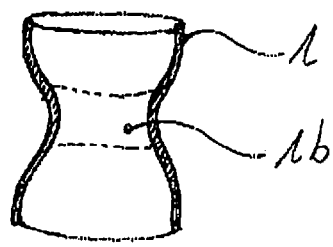
FIG. 1b, shows a tubular body with a peripheral indentation.

FIG. 1b shows a tube 1 with a diameter that is reduced in region 1b and that could also be understood as a peripheral indentation or groove. The tube similarly has a simple waveform that begins, according to the view, at the upper or lower end of the tube with a larger tube diameter than the groove. The wall thickness of the tube is advantageously constant or advantageously as constant as possible. The regions of the tube next to the peripheral indentation 1b could be generated by means of the already mentioned inner pressure shaping method. The indentation advantageously completely surrounds the tube. At the peak region of the shown wave, i.e., in the region in which the tube has its smallest diameter, under mechanical compressive stress, the tube tends to bend inwardly or yield slightly more than at other regions of the tube. Under tensile strain, the same region tends to flatten.

Figure 2:
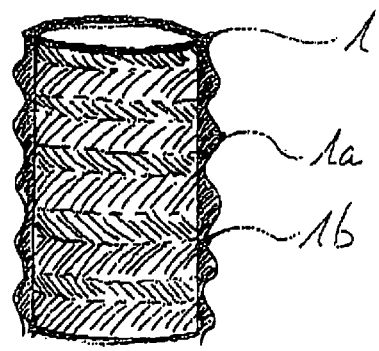
FIG. 2, shows a tubular body with varying wall thickness.

FIG. 2 shows a tube 1 with a waveform, wherein the wall thickness of the tube varies, i.e., is not kept constant. Indentations of the tube or lows of the waveform could here be formed by removing material, such as by means of milling. In the region of each indentation or valley, the tube 1 has a smaller wall thickness than in a region of the tube without indentations. One region of the tube could be dimensioned with reduced wall thickness such that a desired, in particular, reduced spring stiffness is achieved.

Figure 3:
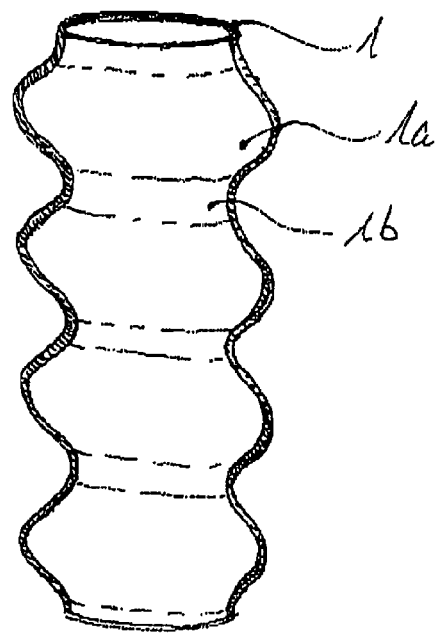
FIG. 3, shows a corrugated tube.

FIG. 3 shows a corrugated tube 1 that can be produced, for example, by means of internal high-pressure shaping of a non-profiled or smooth tube. The tube could also be produced by means of extrusion or deep drawing. According to one embodiment, the corrugated tube could be produced together with a base as a footplate unit.

Figure 4:
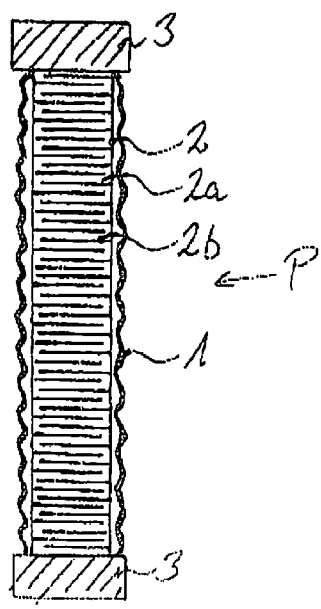
FIG. 4, shows an electrical multiple-layer component arranged in a corrugated tube.

FIG. 4 shows a piezoelectric multiple-layer component 2 that is arranged in a corrugated tube 1 and that has ceramic layers 2a and electrode layers 2b. The arrangement is a component of a piezoelectric actuator P. The multiple-layer component is clamped between two counter layers 3 that are arranged on the ends and that are also directly connected to the corrugated tube, for example, by means of welding. Together with the corrugated tube 1, they place the multiple-layer component 2 under compressive stress. Electrical supply lines that contact the electrode layers 2b could be guided through the counter layer 3.

The bracing element that can be constructed in different ways with a tubular body can be work hardened to increase its strength.

The tubular body can have, in principle, rippling produced through coil-shaped bulges or indentations. Compared with the shown rippling, this arrangement would have a slight tilt. Such a tubular body could be generated, for example, by a production method that is also suitable for forming threads.

What is claimed is:

1. A bracing element for bracing a piezoelectric multiple-layer component, the bracing element comprising a tubular body that includes a wave-shaped region, wherein the tubular body comprises a corrugated tube and wherein the tubular body has a thickness that varies.

2. The bracing element according to claim 1, wherein the wave-shaped region has straight sections.

3. The bracing element according to claim 1, wherein the wave-shaped region has curved sections.

4. The bracing element according to claim 1, wherein the wave-shaped region has continuous waves.

5. The bracing element according to claim 1, wherein an inner diameter of the tubular body is constant.

6. A piezoelectric actuator comprising:
a piezoelectric multiple layer component; and
a bracing element enclosing the component, the bracing element comprising a tubular body that includes a wave-shaped region, wherein the tubular body comprises a corrugated tube, and wherein the tubular body has a thickness that varies.

7. The piezoelectric actuator according to claim 6, wherein the tubular body sets the piezoelectric multiple layer component under an axial compressive stress.

8. The piezoelectric actuator according to claim 7, further comprising two counter layers, wherein the piezoelectric multiple layer component is mechanically connected on each end to one of the counter layers.

9. The piezoelectric actuator according to claim 8, wherein the tubular body is mechanically connected to the counter layers.

10. The piezoelectric actuator according to claim 8, wherein the piezoelectric multiple layer component has inner electrodes that contact electrical supply lines of the piezoelectric actuator.

11. The piezoelectric actuator according to claim 7, wherein the wave-shaped region has continuous waves.

12. The piezoelectric actuator according to claim 7, wherein the tubular body has different cross-axial inner diameters.

13. The piezoelectric actuator according to claim 7, wherein an inner diameter of the tubular body is constant.

14. A bracing element for bracing a piezoelectric multiple-layer component, the bracing element comprising a tubular body that includes a wave-shaped region, wherein the tubular body comprises a corrugated tube and wherein the tubular body has a thickness that varies and wherein the tubular body has different cross-axial inner diameters.

15. The bracing element according to claim 14, wherein the wave-shaped region has straight sections.

16. The bracing element according to claim 14, wherein the wave-shaped region has curved sections.

17. The bracing element according to claim 14, wherein the wave-shaped region has continuous waves.

18. The bracing element according to claim 14, wherein an inner diameter of the tubular body is constant.

* * * * *